United States Patent
Freyermuth

(10) Patent No.: US 8,779,632 B2
(45) Date of Patent: Jul. 15, 2014

(54) SOLAR MODULE

(75) Inventor: Thomas Freyermuth, Kalenborn (DE)

(73) Assignee: Eaton Industries GmbH, Bonn (DE)

( * ) Notice: Subject to any disclaimer, the term of this patent is extended or adjusted under 35 U.S.C. 154(b) by 731 days.

(21) Appl. No.: 13/124,435

(22) PCT Filed: Oct. 9, 2009

(86) PCT No.: PCT/EP2009/007252
§ 371 (c)(1),
(2), (4) Date: Apr. 15, 2011

(87) PCT Pub. No.: WO2010/043343
PCT Pub. Date: Apr. 22, 2010

(65) Prior Publication Data
US 2011/0215643 A1 Sep. 8, 2011

(30) Foreign Application Priority Data
Oct. 16, 2008 (DE) .......................... 10 2008 052 037

(51) Int. Cl.
*H01H 45/00* (2006.01)

(52) U.S. Cl.
USPC ........................................................ 307/118

(58) Field of Classification Search
USPC ........................................................ 307/118
See application file for complete search history.

(56) References Cited

U.S. PATENT DOCUMENTS

| | | | |
|---|---|---|---|
| 7,530,262 B2 * | 5/2009 | Petzold et al. | 73/115.03 |
| 8,056,533 B2 * | 11/2011 | Wagner | 123/321 |
| 2004/0123894 A1 * | 7/2004 | Erban | 136/244 |
| 2006/0077599 A1 | 4/2006 | Laschinksi | |
| 2006/0231132 A1 | 10/2006 | Neussner | |
| 2007/0186969 A1 | 8/2007 | Kohler | |
| 2012/0146420 A1 * | 6/2012 | Wolfs | 307/77 |

FOREIGN PATENT DOCUMENTS

| | | |
|---|---|---|
| DE | 102004054933 B3 | 5/2006 |
| DE | 102005018173 A1 | 10/2006 |
| DE | 102005017835 B3 | 11/2006 |
| DE | 102006026661 A1 | 8/2007 |
| DE | 102006034223 A1 | 1/2008 |

OTHER PUBLICATIONS

Welter P, "Es werde—Dunkelheit Freischaltung von Solarmodulen im Brandfall", Photon—Das Solarstrom-Magazin, 2005, p. 75-77.
European Patent Office, International Search Report in International Patent Application No. PCT/EP2009/007252 Jan. 22, 2010.

* cited by examiner

*Primary Examiner* — Jared Fureman
*Assistant Examiner* — Duc M Pham
(74) *Attorney, Agent, or Firm* — Leydig, Voit & Mayer, Ltd.

(57) ABSTRACT

A solar module includes a plurality of serially connected photovoltaic solar cells and current connections configured to provide solar current generated by the photovoltaic solar cells and configured for connecting the solar module to at least one additional solar module. A mechanical switching contact is connected in parallel with the serially connected solar cells and a pressure actuator is connected to the switching contact. The pressure actuator is configured so as to open the switching contact against the action of a spring element in response to a control pressure above a predetermined threshold and so as to allow closure of the switching contact by action of the spring element in response to a control pressure below the predetermined threshold. The pressure actuator is connected to a control connection for coupling to a control pressure line.

17 Claims, 1 Drawing Sheet

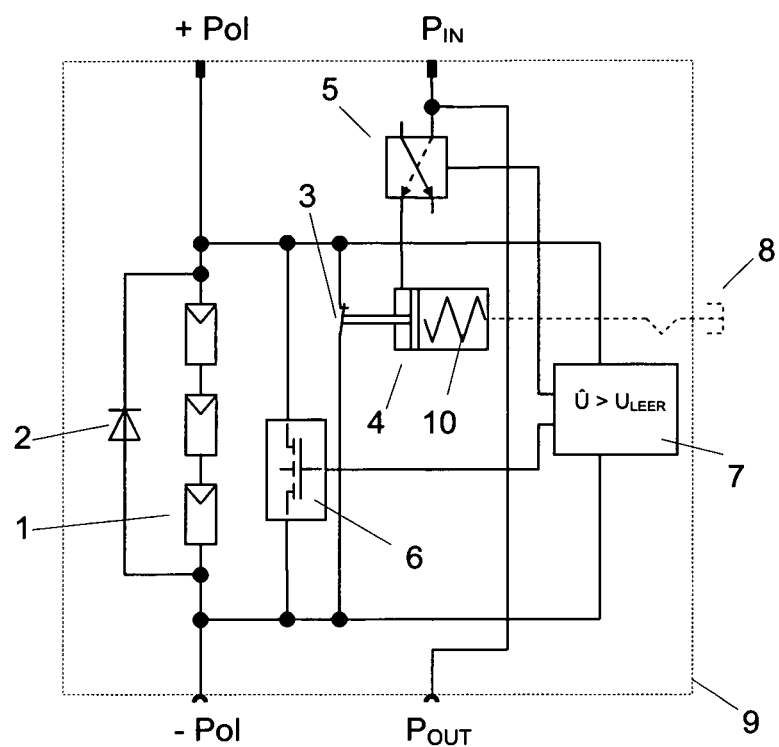

SOLAR MODULE

CROSS REFERENCE TO RELATED APPLICATIONS

This application is a U.S. National Phase application under 35 U.S.C. §371 of International Application No. PCT/EP2009/007252, filed on Oct. 9, 2009, and claims benefit to German Patent Application No. DE 10 2008 052 037.3, filed on Oct. 16, 2008. The International Application was published in German on Apr. 22, 2010 as WO 2010/043343 A1 under PCT Article 21 (2).

FIELD

The invention relates to a photovoltaic solar module including serially connected photovoltaic solar cells.

BACKGROUND

Above a certain intensity of the optical irradiation, a photovoltaic solar cell supplies an electric current that rises with the irradiation intensity. Already above a low irradiation intensity, a voltage is present via the solar cell. The current is drawn in the conventional manner via the current connections of a terminal box. The short-circuit current of a solar cell and thus also of a solar module is only negligibly higher (approximately 5%) than is the case with the rated current supplied in conjunction with the appertaining irradiation. Solar modules consist of a plurality of serially connected photovoltaic solar cells. Solar modules, in turn, are generally serially connected to form a solar array in order to supply a sufficiently high voltage (if applicable, up to 1000 V) to an AC-DC inverter. For safety reasons, the connection of the solar array to the AC-DC inverter can be separated by a direct voltage disconnector switch. In order to increase the performance, a plurality of solar arrays can be connected in parallel or via separate inputs with the interposition of appropriate direct voltage disconnector switches. However, the presence of the direct voltage disconnector switch(es) does not mean that, during exposure to irradiation, a given individual solar module is voltage-free during the assembly of a solar energy installation, during maintenance or repair work, in case of a malfunction or in case of fire, but rather, an open-circuit voltage is indeed present at the current connections of the solar module, causing hazardous touch voltages to occur in the solar energy installation.

According to German patent application DE 10 2006 034 223 A1, the solar module contains a bypass diode that bridges the serially connected solar cells. When the solar module is exposed to solar irradiation, that is to say, when the solar module is generating current, the bypass diode is polarized in the non-conducting direction and thus has no effect on the function of the solar cells. If the solar module within a solar array is temporarily inactive, especially due to shading, this solar module, which is now de-energized, no longer generates voltage, and the bypass diode draws the current for the array from the other solar modules within a solar array. The shaded solar module is protected against damage due to overheating, and the function of the solar array is retained. The bypass diode functions in an analogous manner in case of a defective solar module, and the functionality of the remaining solar array is retained.

According to German patent application DE 10 2006 026 661 A1, in case of a shaded or defective solar module, the power dissipation of the solar module is reduced in that, instead of the bypass diode, a semiconductor switching element is provided that has a low forward voltage, that is blocked by control electronics when the solar module is generating current, and that otherwise is switched with a low resistance. It is a drawback that the current supplied by the solar module is diminished by the current consumed by the control electronics. Moreover, here as well, there is no protection against touch voltages.

German patent DE 10 2005 017 835 B3 describes a photovoltaic generator with a thermal switching element that, when activated, short-circuits the module connection poles or the array connection poles or the connected AC-DC inverter.

German patent DE 10 2005 018 173 B3 describes a switching device for reliably interrupting the operation of photovoltaic installations, whereby the switching device has a protection means that, via a control line, can switch the generator field to a low-energy operating point. In this context, the triggering mechanism connected to the control line is far away from the protection means.

SUMMARY

In an embodiment, the present invention provides a solar module including a plurality of serially connected photovoltaic solar cells and current connections configured to provide solar current generated by the photovoltaic solar cells and to connect the solar module to at least one additional solar module. A mechanical switching contact is connected in parallel with the serially connected solar cells and a pressure actuator is connected to the switching contact. The pressure actuator is configured so as to open the switching contact against the action of a spring element in response to a control pressure above a predetermined threshold and so as to allow closure of the switching contact by action of the spring element in response to a control pressure below the predetermined threshold. The pressure actuator is connected to a control connection for a control pressure line.

BRIEF DESCRIPTION OF THE DRAWINGS

Exemplary embodiments of the present invention are described in more detail below with reference to the drawing, in which:

FIG. 1 shows a switching arrangement of a solar module in accordance with an embodiment of the invention.

DETAILED DESCRIPTION

In an embodiment, the present invention is configured to provide protection against touch voltages.

A mechanical switching contact arranged in parallel to serially connected solar cells ensures that, if needed or in case of damage, the series of solar cells is short-circuited, so that no more voltage is present at the current connections of the solar module. For this purpose, the switching contact is connected as follows to an actuator that responds to pressure: on the one hand, in case of little or no control pressure on the pressure actuator, a spring element closes the switching contact and thus, by short-circuiting the solar cells, changes the solar module to the protected state. On the other hand, when the control pressure is increased, the pressure actuator opens the switching contact and changes the solar module to the active state. The combination of the pressure actuator, the spring element and the switching contact functions as an opener contact, since the switching contact is closed if there is no pressure actuation. The solar module is equipped with a control connection for a control pressure line.

The switching contact, the actuator and the control connection can advantageously be accommodated in a terminal box of the solar module together with the current connections. The control pressure can be supplied in the usual manner via a gaseous or liquid pressure medium by a pressure source that is sufficient for the entire solar energy installation, for example, by a pressure reservoir that can be refilled occasionally as needed, by a compressor that only compensates for a pressure drop, or by a water supply network. Hardly any energy or no energy at all is needed to hold the switching contact in the opened or in the closed state.

Already when the solar module according to the invention is being handled, e.g. when it is being unpacked or connected, the solar module is short-circuited by the switching contact that is necessarily closed by the spring element as a result of the absence of control pressure, as a result of which it is kept voltage-free. During maintenance or repair work, the pressure actuator is rendered inactive by intentionally switching off the control pressure, and consequently the solar module is changed to the voltage-free protected state by closing the switching contact. In case of a damaging effect on a solar energy installation consisting of solar modules according to the invention, for example, in case of a fire or partial destruction, the pressure actuator likewise changes over to the passive state due to the lowering or absence of the control pressure, and this, in turn, brings about a closing of the switching contact, thereby protecting against touch voltages.

An advantageous refinement of the invention consists of configuring the control connection for a control pressure line, for example, in the form of a T-connecting piece that allows a simple connection to additional solar modules that might be present in a solar array. A control device or an emergency OFF switch that is suitable for the employed pressure medium can be connected to the solar array.

Another advantageous refinement of the invention consists of providing an actuation element that can be operated manually and that can be used to intentionally switch on and off the series of solar cells that have been short-circuited by the switching element, for instance, for testing purposes.

For a defined opening and closing of the switching contact, it is advantageous to configure it as a snap-action contact.

An advantageous refinement consists of arranging a voltage monitor in parallel to the series-connected solar cells so that, if the open-circuit voltage of the solar module is substantially exceeded, said voltage monitor obtains the control pressure from the pressure actuator via a valve, thereby causing the solar cells to short-circuit. This refinement achieves a protection in case of polarity reversal or shading of the solar module, which means, for instance, that a bypass diode can be dispensed with. By using a two-way valve, the control pressure can simply be removed from the appertaining solar module and forwarded to other solar modules that are connected to this solar module. The voltage monitor and the valve are advantageously accommodated in the terminal box of the solar module.

In order to more quickly short-circuit the series of solar cells, it is advantageous for a semiconductor switching element—for example, a thyristor or a power MOSFET that is controlled by the voltage monitor—to be arranged in parallel to the switching contact. If the voltage monitor detects that the voltage has been exceeded, the solar cells are very quickly short-circuited by means of the conductive semiconductor element. After the switching contact has closed, which is delayed as a result of mechanical inertia, the semiconductor switching element is bridged and switched off again. Accordingly, only during the response time of the mechanical pressure actuator and of the switching contact does the semiconductor switching element have to be able to switch and carry the current that has to be short-circuited. The semiconductor switching element should advantageously be accommodated in the terminal box of the solar module.

The solar module includes a plurality of series-connected photovoltaic solar cells 1. Via the current connections +pole and −pole, a voltage is present during irradiation, and the generated solar current can be drawn. The current connections +pole and −pole are accommodated in a terminal box 9 that is connected to the solar module. If a plurality of solar modules are connected to form a solar array, the current connections +pole and −pole of these solar modules can be connected in series. The series-connected solar cells 1 are bridged by a bypass diode 2. When the solar module is supplying current, then the bypass diode 2 is blocked by the voltage that is present via the solar cells 1. If the series of solar cells 1 is not generating any voltage, especially due to shading, then the bypass diode 2 is conductive, so that the current supplied by other solar modules of the same solar array is drawn from the bypass diode 2, while sparing the solar cells 1.

The solar module is equipped with a control connection that is accommodated in the terminal box 9 for a pressure medium and that, in this case, consists of a control line input $P_{in}$ and a control line output $P_{out}$ connected directly to said control line input $P_{in}$ via an internal line. If a plurality of solar modules are connected to form a solar array, the control line connections $P_{in}$ and $P_{out}$ of these solar modules can be series-connected by means of normal pressure lines and connecting pieces. The pressure medium provided is, for example, air, whose pressure is supplied by an external pressure reservoir via an external control valve. If the pressure drops, the moderate pressure in the pressure reservoir is supplied by a small compressor of the type known from automatic blood pressure measuring devices. Inside the terminal box 9, the control line input $P_{in}$ is connected via an interposed valve 5 to the cylinder of a pressure actuator 4 in the form of a load cell. The pressure actuator 4 accommodates a spring element 10 that exerts pressure onto the pressure piston of the pressure actuator 4 in a direction opposite to the direction of action of the pressure medium.

A mechanical switching contact 3 configured as a snap-action contact is arranged in the terminal box 9 in parallel to the series-connected solar cells 1. The switching contact 3 is connected to the pressure piston of the pressure actuator 4. In the case of too little or no control pressure, the switching contact 3 is closed by the action of the spring element 10 and kept closed without any expenditure of energy. If sufficient control pressure is exerted onto the pressure actuator 4, then the switching contact 3 is opened while the force of the spring element 10 is overcome, and said switching contact is kept open without any expenditure of energy. A manually operable actuation element 8 is arranged in the terminal box 9 and it acts on the pressure piston of the pressure actuator 4. For testing purposes, the switching contact 3 can be temporarily and intentionally opened by means of the actuation element 8.

The terminal box 9 also accommodates a switching arrangement for the voltage monitor 7 as well as a semiconductor switching element 6 in the form of a power MOSFET, both of which are arranged in parallel to the series of solar cells 1. For control purposes, the voltage monitor 7 is connected via its outputs to the above-mentioned valve 5 and to the semiconductor switching element 6. The valve 5 connects the control line input $P_{in}$ to the pressure actuator 4 when there is no control signal of the voltage monitor 7 as well as during the non-energized state. If the voltage monitor 7 does not detect any overvoltage, then it sends no control signals to the valve 5 and to the semiconductor switching element 6. In this case, the semiconductor switching element 6 is opened and the pressure actuator 4 can be controlled by the control line input $P_{in}$ via the pressure medium.

If the open-circuit voltage generated by the series of solar cells 1 is substantially exceeded—for example, if the solar module is assembled with reversed polarity, or else during shading of the solar module if the bypass diode 2 has been dispensed with or if it has been disconnected as a result of a defect—the voltage monitor 7 sends control signals. As a result, within an extremely short period of time, the semiconductor switching element 6 is closed and thus the series of solar cells 1 is bridged with a low resistance. Moreover, the control pressure—that in this assumed case, is present at the control line input $P_{in}$—is taken from the pressure actuator 4 via the valve 5, with a delay caused by the implicit mechanical inertia, and the switching contact 3 that short-circuits the series of solar cells 1 as well as the semiconductor switching element 6 is closed, causing the semiconductor switching element 6 to open. Consequently, the semiconductor switching element 6 has to switch and carry the current that is to be short-circuited only during the response time of the combination of the valve 5, the pressure actuator 4 and the switching contact 3, whereas the switching contact 3 has to carry this current continuously.

The use of a two-way valve as the valve 5 makes it possible for the control pressure to be taken away only from this solar module and, for the rest, to be forwarded via the control line output $P_{out}$ to additional solar modules that are connected to this solar module.

In the uninstalled state, the solar module according to an embodiment of the invention is not connected to a control pressure line, so that, since there is no control pressure, the switching contact 3 is necessarily closed. As a result, the series of solar cells 1 is short-circuited and voltage-free. The same effect is achieved during maintenance or repair work by switching off the control pressure at the external location. In case of a damaging effect on a solar energy installation made up of solar modules according to the invention, the pressure actuator 4 likewise changes to the passive state when there is little or no control pressure, which, in turn, brings about a closing of the switching contact 3 so that protection against touch voltage is provided. The latter case makes it clear that the magnitude of the control pressure is advantageously selected in such a way that it is just still reliably sufficient to open the switching contact 3 in order to ensure an adequately rapid lowering of the control pressure in case of damage.

The present invention is not limited to the embodiment described above. For example, the solar module according to the invention can also be operated with a fluid pressure medium. The spring element 10 does not have to be part of the pressure actuator 4 but rather, can be connected directly to the switching contact 3 or can be an integral part of it. As the semiconductor switching element 6, it is also possible to use an element having an equivalent function such as, for instance, a thyristor, or a switching arrangement having an equivalent function. The arrangement in the terminal box 9 of all of the components needed for the invention, except for the solar cells 1, is advantageous, but not necessarily required. Moreover, the fundamental protective effect of the invention is also achieved if the semiconductor switching element 6 is dispensed with and also if the voltage monitor 7 and the valve 5 are additionally dispensed with.

LIST OF REFERENCE NUMERALS 1 solar cells
2 bypass diode
3 switching contact
4 actuator
5 valve
6 semiconductor switching element
7 voltage monitor
8 actuation element
9 terminal box
10 spring element
+pole plus current connection
−pole minus current connection
$P_{in}$ control line input
$P_{out}$ control line output

What is claimed is:

1. A solar module comprising:
 a plurality of serially connected photovoltaic solar cells;
 current connections configured to provide solar current generated by the photovoltaic solar cells and to connect the solar module to at least one additional solar module;
 a mechanical switching contact connected in parallel with the serially connected solar cells; and
 a pressure actuator connected to the switching contact, the pressure actuator being configured so as to open the switching contact against the action of a spring element in response to a control pressure above a predetermined threshold and to allow closure of the switching contact by action of the spring element in response to a control pressure below the predetermined threshold, the pressure actuator being connected to a control connection for a control pressure line.

2. The solar module recited in claim 1 further comprising a bypass diode bridging the serially connected solar cells, the bypass diode configured so as to be blocked when the solar module generates current and to, otherwise, be conductive.

3. The solar module recited in claim 1, wherein the control connection is configured for connection with at least one-additional solar module.

4. The solar module recited in claim 3, further comprising an actuation element connected to the switching contact, the actuation element being configured for manual operation of the switching contact.

5. The solar module recited in claim 3, wherein the switching contact includes a snap-action contact.

6. The solar module recited in claim 3 further comprising a voltage monitor connected in parallel to the serially connected solar cells, the voltage monitor being configured to obtain the control pressure from the pressure actuator by a valve in response to a substantial exceeding of an open-circuit voltage of the serially connected solar cells.

7. The solar module recited in claim 3, further comprising a semiconductor switching element coupled in parallel with the switching contact, and a voltage monitor configured to control the semiconductor switching element.

8. The solar module recited in claim 1, further comprising an actuation element connected to the switching contact, the actuation element being configured for manual operation of the switching contact.

9. The solar module recited in claim 8, wherein the switching contact includes a snap-action contact.

10. The solar module recited in claim 8 further comprising a voltage monitor connected in parallel to the serially connected solar cells, the voltage monitor being configured to obtain the control pressure from the pressure actuator by a valve in response to a substantial exceeding of an open-circuit voltage of the serially connected solar cells.

11. The solar module recited in claim 8, further comprising a semiconductor switching element coupled in parallel with the switching contact, and a voltage monitor configured to control the semiconductor switching element.

12. The solar module recited in claim 1, wherein the switching contact includes a snap-action contact.

13. The solar module recited in claim 12 further comprising a voltage monitor connected in parallel to the serially connected solar cells, the voltage monitor being configured to obtain the control pressure from the pressure actuator by a valve in response to a substantial exceeding of an open-circuit voltage of the serially connected solar cells.

14. The solar module recited in claim 12, further comprising a semiconductor switching element coupled in parallel with the switching contact, and a voltage monitor configured to control the semiconductor switching element.

15. The solar module recited in claim 1 further comprising a voltage monitor connected in parallel to the serially connected solar cells, the voltage monitor being configured to obtain the control pressure from the pressure actuator by a valve in response to a substantial exceeding of an open-circuit voltage of the serially connected solar cells.

16. The solar module recited in claim 15, further comprising a semiconductor switching element coupled in parallel with the switching contact, wherein the voltage monitor is configured to control the semiconductor switching element.

17. The solar module recited in claim 1, further-comprising a semiconductor switching element coupled in parallel with the switching contact, and a voltage monitor configured to control the semiconductor switching element.

* * * * *